(12) United States Patent
Furukawa et al.

(10) Patent No.: US 7,064,326 B2
(45) Date of Patent: Jun. 20, 2006

(54) ELECTRON MICROSCOPE

(75) Inventors: Hiromitsu Furukawa, Tokyo (JP);
Miyoko Shimizu, Tokyo (JP)

(73) Assignees: JEOL Ltd., Tokyo (JP); JEOL System Technology Co., Ltd., Tokyo (JP)

( * ) Notice: Subject to any disclaimer, the term of this patent is extended or adjusted under 35 U.S.C. 154(b) by 66 days.

(21) Appl. No.: 10/876,300

(22) Filed: Jun. 24, 2004

(65) Prior Publication Data

US 2005/0029452 A1 Feb. 10, 2005

(51) Int. Cl.
*G01N 23/00* (2006.01)
*G21K 7/00* (2006.01)

(52) U.S. Cl. ..................... 250/311; 250/311
(58) Field of Classification Search .............. None
See application file for complete search history.

(56) References Cited

U.S. PATENT DOCUMENTS 5,278,408 A  1/1994  Kakibayashi et al.
5,866,905 A * 2/1999  Kakibayashi et al. ........ 250/311

FOREIGN PATENT DOCUMENTS

JP        04-337236        11/1992

* cited by examiner

*Primary Examiner*—John R. Lee
*Assistant Examiner*—Jennifer Yantorno
(74) *Attorney, Agent, or Firm*—The Webb Law Firm (57) ABSTRACT

An electron microscope is offered which can analyze the three-dimensional structure of a specimen without sectioning it by making use of computerized tomography. The microscope has solved the problems intrinsic to the microscope and permits application of computerized tomography to general cases. A series of transmission images is obtained by tilting the specimen by plural angles. Two-dimensional correlation processing is performed between each of the series of images and a reference image. The same field of view is selected and extracted. Thus, positional deviation of the specimen is corrected.

6 Claims, 5 Drawing Sheets

ELECTRON MICROSCOPE

BACKGROUND OF THE INVENTION

1. Field of the Invention

The present invention relates to a transmission electron microscope (TEM) capable of analyzing the three-dimensional structure of a specimen without sectioning it.

2. Description of Related Art

In the past, analysis of the three-dimensional structure of a specimen in TEM (transmission electron microscopy), i.e., three-dimensional reconstruction, has been performed by cutting ultrathin sections from the specimen and stacking TEM images of the sections. This procedure is also known as successive sectioning.

In this procedure, however, much labor is necessary to section a specimen. Furthermore, information about the height depends on the thickness of each section. Therefore, it has been difficult to obtain information providing a sufficient degree of quantitativeness and resolution because of thickness variations among the sections.

In recent years, attempts to reconstruct TEM images in three dimensions by making use of computerized tomography (CT) have been proposed. The CT method is a procedure consisting of reconstructing the internal distribution within an object from the principles of Radon and inverse Radon transforms. Its applications using X-rays in the medical field are well known.

If this CT method is applied to electron microscopy, a three-dimensional image containing information about the inside of a specimen can be reconstructed without sectioning it simply by obtaining TEM images in succession while varying the tilt angle of the specimen stage supporting the specimen. For example, Japanese Patent Laid-Open No. H4-337236 is known as a patent reference regarding an electron microscope for obtaining such three-dimensional images.

Where the CT method is applied to electron microscopy as mentioned previously, however, there are some problems intrinsic to electron microscopy, i.e., limitations on the tilt angle of the specimen stage and problems associated with identification of the axis of rotation and rotation and shift of the image.

For these reasons, the application of the CT method to electron microscopy has been limited to special cases.

SUMMARY OF THE INVENTION

It is an object of the present invention to provide an electron microscope capable of analyzing the three-dimensional structure of a specimen without sectioning it by making use of computerized tomography. It is another object of the present invention to provide an electron microscope permitting application of computerized tomography to general cases by solving the problems intrinsically occurring when computerized tomography is applied to the electron microscope, i.e., limitations on the tilt angle of the specimen stage and problems associated with identification of the axis of rotation and rotation and shift of the image.

An electron microscope according to the present invention solves the above-described problems and acts to direct an electron beam at a specimen supported tiltably and to gain TEM images based on electrons transmitted through the specimen. The microscope is fitted with a signal processing circuit for implementing computerized tomography based on data about the gained TEM images of the specimen. The signal processing circuit selects and extracts the same field of view from a series of TEM images obtained by tilting the specimen by plural angles by two-dimensional correlation processing between each TEM image and a reference image. Thus, positional deviation of the specimen is corrected.

Other objects and features of the present invention will appear in the course of the description thereof, which follows.

DESCRIPTION OF THE PREFERRED EMBODIMENTS

The preferred embodiments of the present invention are hereinafter described with reference to the accompanying drawings.

Figure 1:
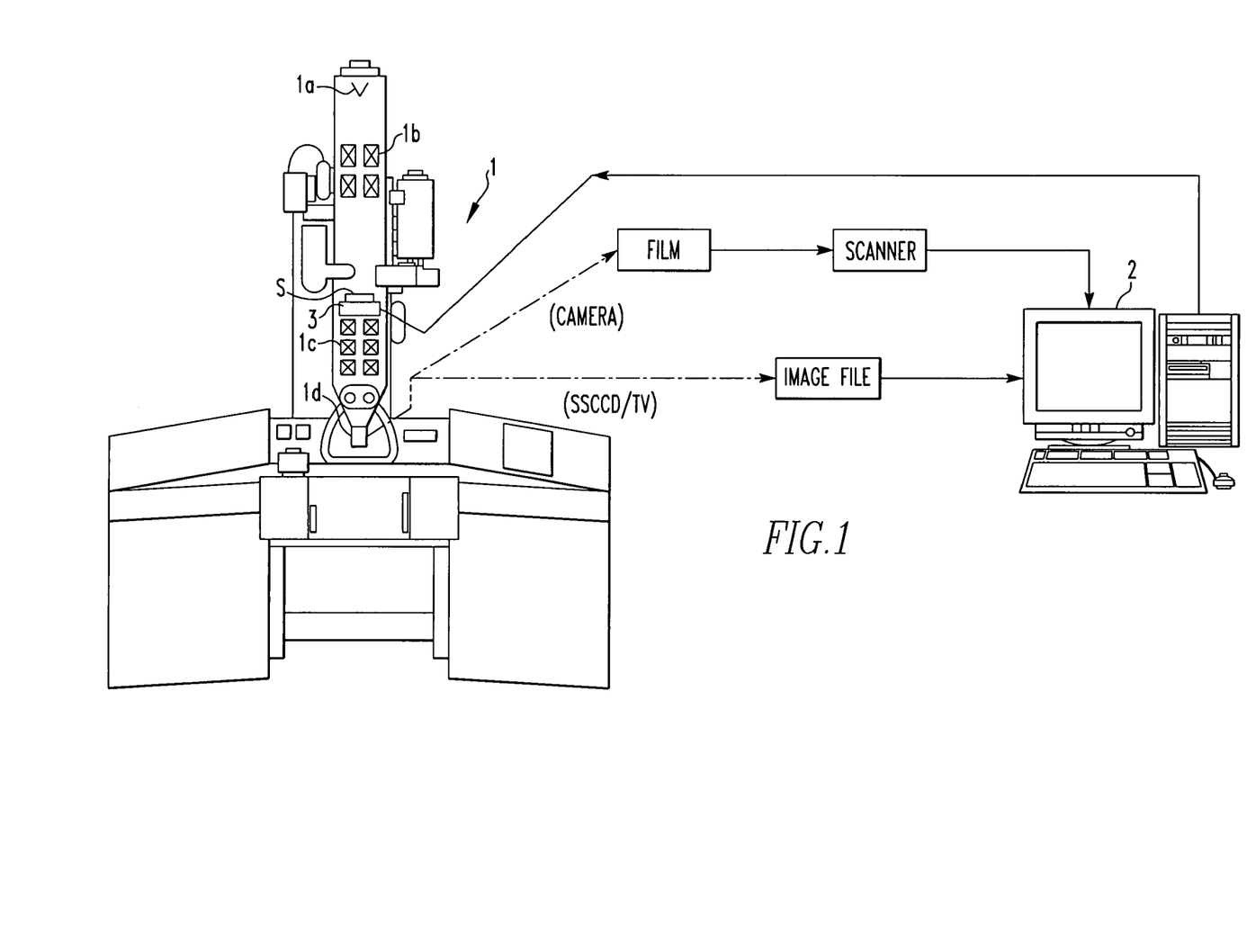
FIG. 1 is a schematic view of an electron microscope according to the present invention, showing the whole outer appearance.

FIG. 1 is a schematic view of an electron microscope according to the present invention, showing its whole appearance.

The electron microscope, generally indicated by reference numeral 1, according to the present invention is a transmission electron microscope (TEM) and has an electron gun 1*a* emitting an electron beam, an illumination lens system 1*b* (condenser lens system) for directing the beam at a specimen S, a focusing lens system 1*c* for focusing a TEM image based on electrons transmitted through the specimen, and a TEM image detector 1*d* for detecting the focused TEM image.

The electron microscope 1 performs a three-dimensional reconstruction of the TEM image by CT (computerized tomography). The microscope 1 is fitted with a signal processing circuit (computer) 2 for implementing a CT procedure based on the TEM image of the specimen gained by the TEM image detector 1*d*.

In this electron microscope, the specimen is supported on a specimen stage 3 capable of being rotated and tilted. The stage 3 can be automatically moved under control of the signal processing circuit 2.

The signal processing circuit 2 accepts necessary information while moving the specimen stage 3 in various kinds of processing (described later) and performs these kinds of processing automatically.

Principle of Computerized Tomography

Figure 2:
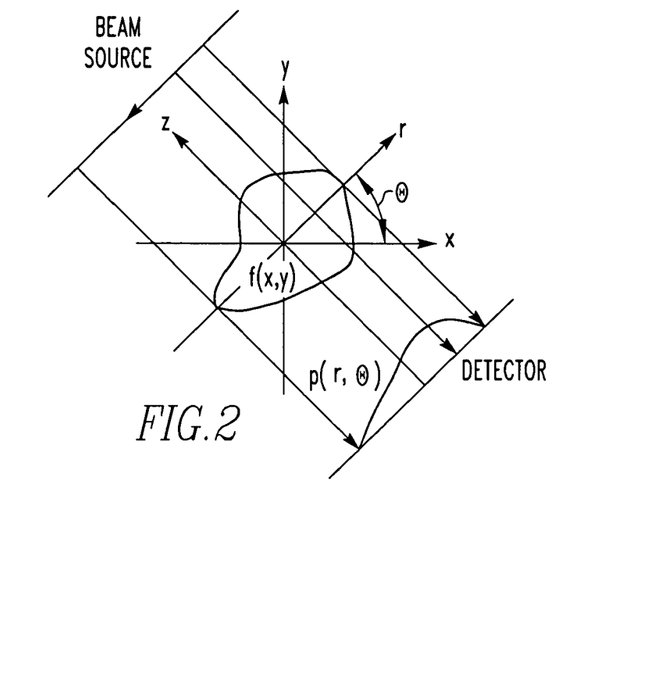
FIG. 2 is a plan view illustrating the principle of the CT method applied to the electron microscope according to the present invention.

FIG. 2 is a plan view illustrating the principle of computerized tomography (CT) applied to the electron microscope according to the present invention.

In CT, X-rays or electron beam is first made to hit a specimen whose cross sections should be observed, and TEM images of the sections are obtained. This sequence of steps is known as projection. In this projection, the X-rays or electron beam is made to hit the specimen as shown in FIG. 2. The intensity of the beam transmitted through the specimen is measured. Let f (x,y) be the distribution of the absorption coefficient of one cross section for the beam. Let $I_i$ be the intensity of the illuminating beam. Let $I_0$ be the intensity of the beam transmitted through the specimen. Then, the following relation holds:

$$\int_s f(x, y) ds = \ln \frac{I_i}{I_0} \quad (1)$$

Modification of this equation gives rises to:

$$I_0 = I_i e^{-\int_s f(x,y)ds} \quad (2)$$

where ds is a line element along the beam. The intensity of the beam is constant.

We now introduce a coordinate system rotated through θ from the x-y coordinate system. The projection p (r, θ) in the θ-direction is defined by $$p(r, \theta) = \int_{-\infty}^{\infty} f(r\cos\theta - s\sin\theta, r\sin\theta + s\cos\theta) ds \quad (3)$$
$$= \int_{-\infty}^{\infty}\int_{-\infty}^{\infty} f(x, y)\delta(x\cos\theta + y\sin\theta - r) dx dy$$

where δ is the Dirac's delta function and r and s are given by $$\begin{matrix} r = x\cos\theta + y\sin\theta \\ s = -x\sin\theta + y\cos\theta \end{matrix} \Big\} \quad (4)$$

The integral transform that makes f (x,y) correspond to p (r, θ) as mentioned previously is known as the Radon transform. The cross-sectional reconstruction from the projections is carried out by an inverse process of this transform, i.e., inverse Radon transform (back projection). This is hereinafter referred to as the back projection.

The f (x,y) can be easily found from the p (r, θ) by using a two-dimensional Fourier transform. From the definition, the two-dimensional Fourier transform of f (x,y) is given by $$F(\mu, \nu) = \int_{-\infty}^{\infty}\int_{-\infty}^{\infty} f(x, y) e^{-j2\pi(\mu x + \nu y)} dx dy \quad (5)$$

F (μ, ν) is expressed using polar coordinates by performing variable transforms μ=ρcos θ and ν=ρsin θ. Thus, we have $$F(\rho\cos\theta, \rho\sin\theta) = \int_{-\infty}^{\infty}\int_{-\infty}^{\infty} f(x, y) e^{-j2\pi\rho(x\cos\theta + y\sin\theta)} dx dy \quad (6)$$

Introducing the relations given by Eq. (4) above into Eq. (6) results in $$F(\rho\cos\theta, \rho\sin\theta) = \quad (7)$$
$$\int_{-\infty}^{\infty}\left[\int_{-\infty}^{\infty} f(r\cos\theta - s\sin\theta, r\sin\theta + s\cos\theta) ds\right] e^{-j2\pi\rho r} dr$$
$$= \int_{-\infty}^{\infty} p(r, \theta) e^{-j2\pi\rho r} dr$$

It can be seen from Eq. (7) that a spectrum obtained by a Fourier transform of the θ-direction projection p (r, θ) with respect to r is equal to a cross section obtained by cutting a spectrum in the θ-direction, the latter spectrum being obtained by a two-dimensional transform of f (x, y).

Figure 3:
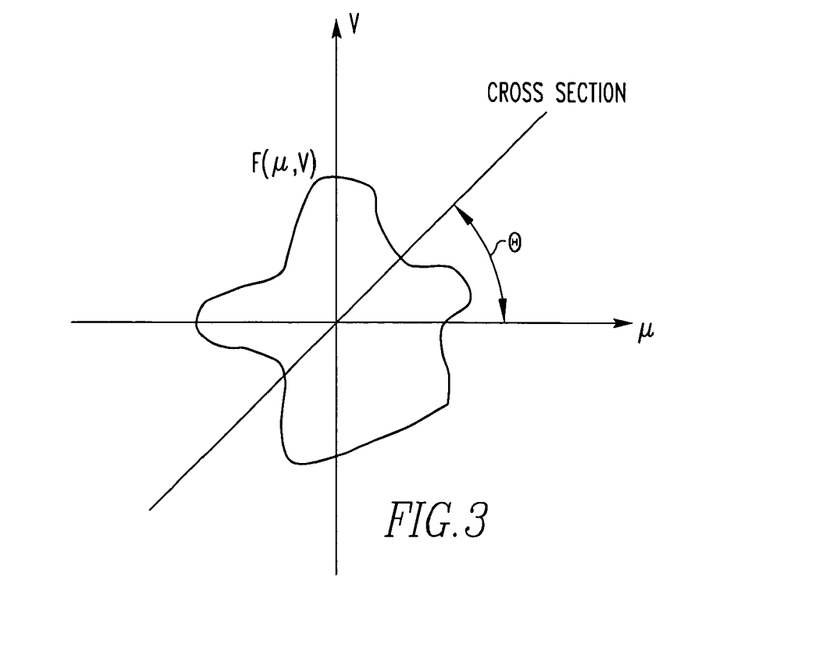
FIG. 3 is a plan view showing a spectrum obtained by performing a two-dimensional Fourier transform of f (x,y) in the CT method and cutting the spectrum in the direction of $\theta$.

The spectrum obtained by the two-dimensional transform of f (x, y) has been cut in the θ-direction. FIG. 3 is a plan view showing the resulting state.

Accordingly, a two-dimensional (2D) Fourier spectrum of cross sections of the specimen can be found by Fourier-transforming projections from all directions through the specimen and arraying the resulting spectra in a Fourier space. Cross-sectional images of the specimen can be obtained by inverse-Fourier transforming the 2D Fourier spectrum.

In this way, a two-dimensional image (cross-sectional image) can be reconstructed from one-dimensional projections. Since a TEM image is a 2D projection, a three-dimensional image can be reconstructed simply by rotating the specimen along the axis of rotation.

Figure 4:
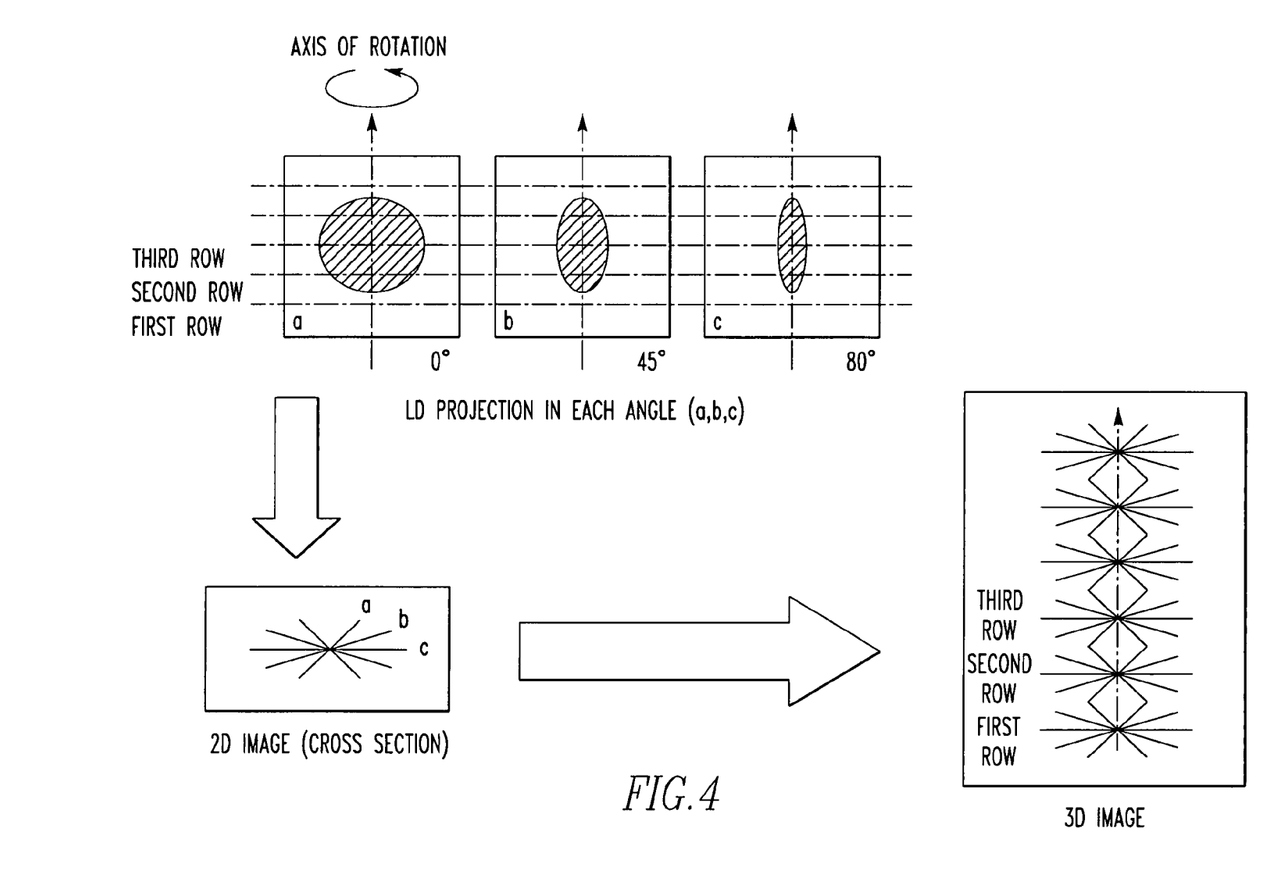
FIG. 4 is a diagram illustrating the process of reconstruction of a three-dimensional image in the CT method.

FIG. 4 is a diagram illustrating the process for reconstructing a three-dimensional image. That is, a data array in a direction perpendicular to the axis of rotation is regarded as a 1D projection. A cross-sectional image is reconstructed from projections from various angles. A 3D image can be obtained by stacking 2D images obtained in this way along the axis of rotation.

Solution of Positional Deviation of Specimen

Where a 3D image is reconstructed by computerized topography as described above, strict positional alignment of the specimen is required. Especially, where observations are made at high magnifications, positioning dependent on mechanical accuracy does not suffice. Furthermore, where a transmission image is printed on film or paper without using a slow scan CCD (SSCCD) camera, it is necessary to obtain data from the image on the film by means of a scanner. When the film is set on the scanner, positional deviation occurs, shifting each TEM image greatly.

In an electron microscope according to the present invention, a series of transmission images is obtained by tilting the specimen in incremental angular steps. The same field of view is selected and extracted from the series of transmission images by two-dimensional correlation processing. In this way, the problem of positional deviation of the specimen is solved.

Figure 5:
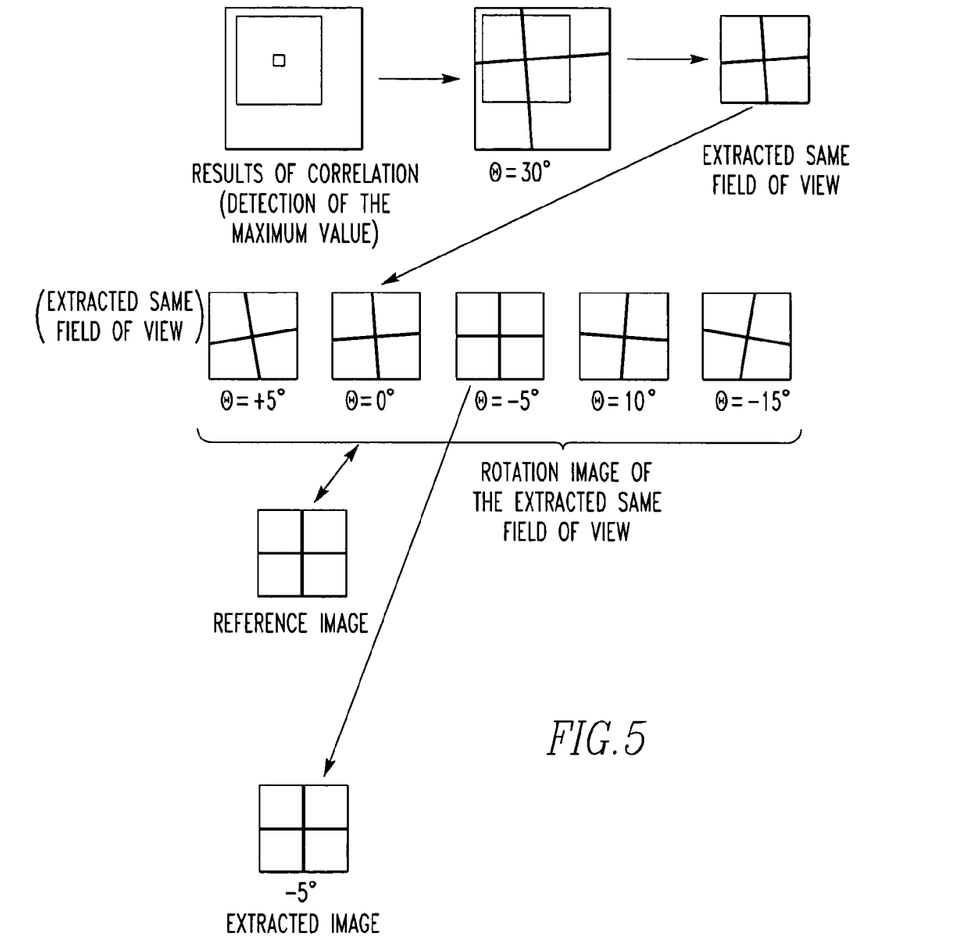
FIG. 5 is a diagram illustrating the process of selecting and extracting the same field of view by two-dimensional correlation processing from a series of TEM images obtained by tilting a specimen in incremental angular steps in the electron microscope according to the present invention.

FIG. 5 is a diagram illustrating the process for selecting and extracting the same field of view from a series of transmission images by two-dimensional correlation processing, the series of transmission images being obtained by tilting a specimen in incremental angular steps.

That is, in this electron microscope, two-dimensional correlation processing is performed between each obtained transmission image and a reference image. Parts of the transmission images which have the same field of view as the reference image are extracted from the transmission images at different angles. Computerized tomography is done using the extracted images. The reference image is obtained by extracting an image of a part of field of view from the transmission image obtained when the specimen stage is at some tilt angle (e.g., 0°).

As a premise for conducting two-dimensional correlation processing, if the trend of the contrast of each transmission image is first removed, it is expected that the accuracy will be improved. The trend in each transmission image may occur according to the state of the specimen or the operating conditions, such as tilt of the specimen stage. Furthermore, image concentration variations due to specimen thickness nonuniformity might be observed.

If such a trend is present, the accuracy at which each transmission image is extracted by two-dimensional correlation processing that corresponds to positional alignment of the specimen may deteriorate or an image of an entirely different field of view might be extracted.

Accordingly, the accuracy at which transmission images are extracted by two-dimensional correlation processing can be improved by removing the trend in the transmission images (i.e., by removing first-order component or bias component).

The first-order component can be removed by the following procedure. First, a first-order plane [p (x,y)] is found by applying the least squares method to the image [f (x,y)]. Then, an image [f' (x,y)] from which the first-order and bias components have been removed can be found using the following equation.

$$f'(x,y)=f(x,y)-p(x,y) \quad (8)$$

In the 2D correlation processing, the portion providing a maximum amount of correlation out of a transmission image is used as a reference in performing an alignment or extracting an image. Therefore, even in a case where the transmission image has deteriorated severely and the alignment is impossible to perform in practice, the portion giving a maximum amount of correlation out of the transmission image will be used as a reference in performing an alignment.

For example, where the contrast of the transmission image is low and the same value is repetitively obtained from within the same transmission image, or where the maximum value obtained from the transmission image is extremely low, the reliability that the identified maximum value is a true maximum value is low. In this case, the reliability of the alignment (extraction of image) is deteriorated severely.

Accordingly, in this electron microscope, a certain decision criterion is established about the maximum value of the results of correlation. A value that does not satisfy this criterion is not used as the results of the two-dimensional correlation processing. In this way, the reliability of positional alignment (image extraction) is secured.

In particular, in this electron microscope, the maximum value [Max] of the results of correlation must satisfy the following relation:

[Max]>n×[Ave] (where n varies depending on the image quality; for example, n=2) where [Ave] is the average value of the correlation over the whole transmission image. For the correlation, c of Eq. (9) or (10) described later is used, for example.

Furthermore, in this electron microscope, when 2D correlation processing is performed, rotation (tilt) (i.e., deviation in the θ-direction) within the transmission image should be taken into account, as well as translational shifts (deviations in the X- and Y-directions) of the transmission image.

Usually, the degree of similarity c (i, j) used where an area similar to a reference image g (x−i, y−j) is found from an image f (x, y) of interest using 2D cross-correlation is given by $$c(i,j)=\int\int f(x,y)g(x-i,y-j)dx\,dy \quad (9)$$

In this case, the degree of similarity is calculated in succession while translating the reference image within the image of interest. Because of the characteristics of the electron microscope, rotational movement is produced between the reference image and the image of interest.

Accordingly, Eq. (9) is modified into Eq. (10) by adding a rotation through θ within the xy plane with respect to a point within the image. This point within the image does not need to be the center of the image as long as it is a fixed point.

$$c(i,j,\theta)=\int\int f(x,y)g(x-i,y-j,\theta)dx\,dy\,d\theta \quad (10)$$

That is, an image of a field of view that will become a reference image is extracted from a transmission image when the specimen stage is at some tilt angle (e.g., 0°). Then, 2D correlation processing is performed between the reference image and a transmission image derived when the specimen stage is at a different tilt angle. A field of view producing a maximum amount of correlation is extracted. The extracted field of view is rotated or tilted in the direction of θ within the transmission image. Each such a field of view is multiplied with the reference image, and the total sum is taken. An image closest to the reference image can be obtained by adopting the maximum value of those values. That is, the rotation (tilt) in the direction of θ within the transmission image is corrected. This processing is carried out repetitively. In consequence, images of the same field of view can be accurately extracted regarding transmission images at all tilt angles.

In this electron microscope, with respect to the reference image for carrying out 2D correlation processing, an image extracted from the transmission image obtained when the specimen stage is at some tilt angle (e.g., 0°) is not used for transmission images at all tilt angles. Rather, an image of the same field of view extracted from a transmission image at a different tilt angle using some reference image is used as a new reference image for 2D correlation processing between the reference image and a transmission image at a further tilt angle.

Figure 6:
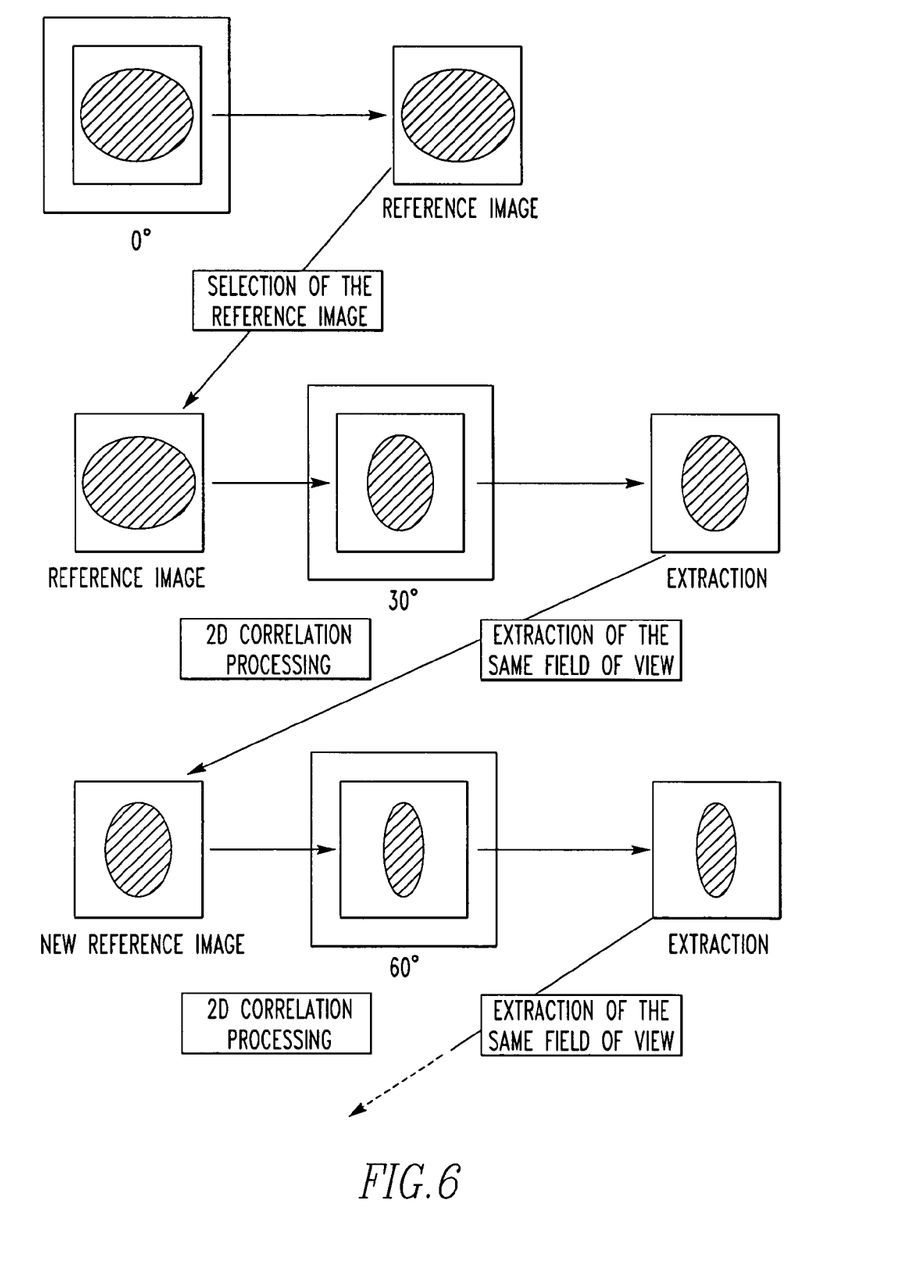
FIG. 6 is a diagram showing one example of a process of performing two-dimensional correlation processing using successively new reference images.

FIG. 6 is a diagram showing one example of process of performing 2D correlation processing using successively new reference images.

For example, as shown in FIG. 6, using a reference image extracted from a transmission image obtained when the tilt angle of the specimen stage is 0°, an image of the same field of view is extracted from a transmission image obtained when the tilt angle of the stage is 30°. In this way, using an image extracted from a transmission image obtained when the tilt angle of the stage is 30° as a new reference image, an image of the same field of view is extracted from a transmission image obtained when the tilt angle of the stage is 60°. Consequently, it is possible to avoid the problem that the difference in tilt angle of specimen stage between the reference image and the image to be processed is too large to perform the processing.

Identification of Axis of Rotation

Where a 3D image is reconstructed using computerized tomography, back projection is performed on the assumption that the axis of rotation and rotational angle were known when the transmission image was derived. Especially, information about the axis of rotation is important. The information about the axis of rotation cannot be obtained from the microscope image. A procedure in which the specimen is marked by some method has been proposed, but sufficient accuracy cannot be obtained. Hence, it cannot be said that this technique is a practical procedure.

In the electron microscope according to the present invention, the amount of deviation between the center of range in which a 3D image is reconstructed and the mechanical axis of rotation is added during back projection. This offers latitude in selecting a field of view. Therefore, an accurate reconstructed image is obtained. The amount of deviation can be found probabilistically from successive projection images. For example, the amount of deviation is optimized such that a good reconstructed image is obtained.

Solution of Limitations on Specimen Stage Angle

In order to fully reconstruct a cross-sectional image of a specimen by the use of computerized tomography, projections (i.e., gaining of transmission images) from a range of ±90° are necessary. Where limitations are placed on this angular range, information from directions along which no transmission images are obtained is missing and so reconstruction from a certain angular range is impossible to achieve.

In actual specimen stages that support specimens, there are limitations on their tilt angle. Furthermore, at a large tilt angle, the apparent thickness of the specimen is increased except where the specimen is spherical or cubic. In this case, it is impossible to gain transmission images.

In an attempt to solve this problem, a procedure in which a function is extrapolated and an estimative procedure using a probabilistic process have been proposed. However, there are problems including production of virtual images.

In the electron microscope according to the present invention, the aforementioned problem is circumvented by taking the practically achievable maximum tilt angles of ±60° as recommended conditions for obtaining transmission images and adjusting the operating conditions under which 3D images are observed.

Accuracy of Specimen Stage Angle

When projections are performed to gain transmission images, the specimen stage is controlled manually. At this time, mechanical error (backlash) and angular error due to error in reading the scale are produced.

It is assumed that the projection angles are set in units of 1°. If the rotational angle of the specimen stage contains error much greater than 1°, it is possible to reconstruct 3D images.

Number of Projections

According to the principle of computerized tomography, a 2D Fourier space cannot be filled up unless projections are performed while varying the angle of the specimen continuously. In practice, however, such projections are impossible to perform.

In practice, if 17 projections are performed at angular steps of 10°, for example, reconstruction of a 3D image is possible. Where limitations on the tilt angle of the specimen stage, the operating conditions of the projection process, and the shape of the specimen are taken into consideration, it is desired that more than about 20 projections be performed.

As mentioned previously, in the electron microscope according to the present invention, two-dimensional correlation processing is performed between each of a series of transmission images obtained by tilting the specimen by plural angles and a reference image to thereby select and extract the same field of view. Positional deviation of the specimen is corrected. Therefore, an accurate 3D image can be reconstructed.

Furthermore, in the electron microscope according to the present invention, the effects of the trend of the contrast of each transmission image are removed before the aforementioned two-dimensional correlation processing is performed. Consequently, the accuracy at which the transmission images are extracted by the 2D correlation processing can be improved.

Moreover, in the electron microscope according to the present invention, a certain decision criterion is established about the maximum value of the correlation results of the 2D correlation processing. Values not satisfying the criterion are not used as the results of the 2D correlation processing. Hence, the reliability of the correlation results of the 2D correlation processing can be secured.

In addition, in the electron microscope according to the present invention, during the 2D correlation processing, translational shifts of the transmission images and rotations within the images are also corrected. As a result, an image closest to the reference image can be obtained.

Further, in the electron microscope according to the present invention, an image of the same field of view is extracted from a transmission image at a different tilt angle by the use of a reference image. The extracted image is used as a new reference image. Two-dimensional correlation processing is performed between this new reference image and a transmission image at a still other tilt angle. As a result, it is possible to circumvent the problem that the difference in tilt angle of stage between the reference image and the image to be processed is so large that the processing cannot be performed.

Additionally, in the electron microscope according to the present invention, the amount of deviation between the center of the range of reconstruction of a 3D image and the mechanical axis of rotation is added during inverse. Radon transform. This offers latitude in selecting a field of view. Hence, an accurate reconstructed image can be obtained.

That is, the present invention makes it possible to analyze the three-dimensional structure of a specimen without sectioning it, by making use of computerized tomography. Furthermore, problems intrinsically occurring when computerized tomography is applied to electron microscopy, i.e., limitations on the tilt angle of the specimen stage and problems associated with identification of the axis of rotation and rotation and shift of the image, are solved. As a result, an electron microscope that can utilize the computerized tomography in general cases can be offered.

Having thus described our invention with the detail and particularity required by the Patent Laws, what is desired protected by Letters Patent is set forth in the following claims.

The invention claimed is:

1. An electron microscope for directing an electron beam at a specimen supported to be tilted about a fixed axis in plural incremental angles and gaining TEM images based on electrons transmitted through the specimen, the microscope being fitted with a signal processing circuit for implementing computerized tomography according to data about the gained TEM images of the specimen, wherein said signal processing circuit performs two-dimensional correlation processing between each image of a series of TEM images obtained from the specimen tilted by plural angles and a reference image comprising one of said images in the series of images to thereby select and extract an identical field of view from each image, whereby correcting positional deviation of the specimen and using said extracted fields of view for implementing computerized tomography.

2. An electron microscope as set forth in claim 1, wherein said signal processing circuit removes effects of trend of the contrast of each TEM image before the two-dimensional correlation processing is performed.

3. An electron microscope as set forth in claim 1, wherein said signal processing circuit has a certain decision criterion about a maximum value of correlation results of the two-dimensional correlation processing and does not use values not satisfying the criterion as the results of the two-dimensional correlation processing.

4. An electron microscope as set forth in claim 1, wherein said signal processing circuit corrects translational shifts of the TEM images and rotations within the TEM images when the two-dimensional correlation processing is performed.

5. An electron microscope as set forth in claim 1, wherein said signal processing circuit performs two-dimensional correlation processing between a new reference image and a TEM image at a further tilt angle, the new reference image being an image of the same field of view extracted from a TEM image at a different tilt angle using the first-mentioned reference image.

6. An electron microscope as set forth in claim 1, wherein said signal processing circuit adds an amount of deviation between a center of a range in which three-dimensional images are reconstructed and a mechanical center of axis when an inverse Radon transform is performed.

* * * * *

UNITED STATES PATENT AND TRADEMARK OFFICE
CERTIFICATE OF CORRECTION

PATENT NO. : 7,064,326 B2
APPLICATION NO. : 10/876300
DATED : June 20, 2006
INVENTOR(S) : Furukawa et al.

It is certified that error appears in the above-identified patent and that said Letters Patent is hereby corrected as shown below:

Title Page, Insert the following:

(30)     Foreign Application Priority Data
June 26, 2003          (JP)     2003-182739

Signed and Sealed this

Twenty-eighth Day of November, 2006

JON W. DUDAS
*Director of the United States Patent and Trademark Office*